(12) United States Patent
Bauer

(10) Patent No.: US 7,208,354 B2
(45) Date of Patent: Apr. 24, 2007

(54) DEPOSITION OF SILICON GERMANIUM ON SILICON-ON-INSULATOR STRUCTURES AND BULK SUBSTRATES

(75) Inventor: Matthias Bauer, Phoenix, AZ (US)

(73) Assignee: ASM America, Inc., Phoenix, AZ (US)

( * ) Notice: Subject to any disclaimer, the term of this patent is extended or adjusted under 35 U.S.C. 154(b) by 27 days.

(21) Appl. No.: 10/897,985

(22) Filed: Jul. 23, 2004

(65) Prior Publication Data

US 2005/0054175 A1 Mar. 10, 2005

Related U.S. Application Data

(60) Provisional application No. 60/489,691, filed on Jul. 23, 2003.

(51) Int. Cl.
*H01L 21/00* (2006.01)
(52) U.S. Cl. ................ 438/151; 438/404; 438/154
(58) Field of Classification Search ............. 438/151, 438/404, 154
See application file for complete search history.

(56) References Cited

U.S. PATENT DOCUMENTS

| | | | |
|---|---|---|---|
| 4,363,828 A | | 12/1982 | Brodsky et al. |
| 5,461,250 A | * | 10/1995 | Burghartz et al. ......... 257/347 |
| 6,346,732 B1 | | 2/2002 | Mizushima et al. |
| 6,395,621 B1 | | 5/2002 | Mizushima et al. |
| 6,411,548 B1 | * | 6/2002 | Sakui et al. ............ 365/185.17 |
| 6,455,871 B1 | * | 9/2002 | Shim et al. .................... 257/12 |
| 6,461,945 B1 | * | 10/2002 | Yu ............................. 438/510 |
| 6,464,780 B1 | | 10/2002 | Mantl et al. |
| 6,482,705 B1 | * | 11/2002 | Yu ............................. 438/300 |
| 6,562,703 B1 | | 5/2003 | Maa et al. |
| 6,649,980 B2 | * | 11/2003 | Noguchi ..................... 257/351 |
| 6,855,436 B2 | | 2/2005 | Bedell et al. |
| 6,861,158 B2 | | 3/2005 | Bedell et al. |
| 6,875,279 B2 | | 4/2005 | Chu et al. |
| 2003/0445063 | | 3/2003 | Hernandez et al. |
| 2003/0082300 A1 | | 5/2003 | Todd et al. |

(Continued)

FOREIGN PATENT DOCUMENTS

EP 0858101 2/1998

(Continued)

OTHER PUBLICATIONS

Bauer et al., "Time Resolved Reflectivity Measurements of Silicon Phase Epitaxial Regrowth", Thin Solid Films 364:228-232 (2000).

(Continued)

*Primary Examiner*—Laura M. Schillinger
(74) *Attorney, Agent, or Firm*—Knobbe, Martens, Olson & Bear LLP

(57) ABSTRACT

Methods are provided for producing SiGe-on-insulator structures and for forming strain-relaxed SiGe layers on silicon while minimizing defects. Amorphous SiGe layers are deposited by CVD from trisilane and $GeH_4$. The amorphous SiGe layers are recrystallized over silicon by melt or solid phase epitaxy (SPE) processes. The melt processes preferably also cause diffusion of germanium to dilute the overall germanium content and essentially consume the silicon overlying the insulator. The SPE process can be conducted with or without diffusion of germanium into the underlying silicon, and so is applicable to SOI as well as conventional semiconductor substrates.

22 Claims, 10 Drawing Sheets

Liquidus-solidus curves of the Si-Ge system

U.S. PATENT DOCUMENTS

| | | |
|---|---|---|
| 2003/0124818 A1 | 7/2003 | Luo et al. |
| 2003/0143783 A1 | 7/2003 | Maa et al. |
| 2003/0157787 A1 | 8/2003 | Murthy et al. |
| 2003/0207127 A1 | 11/2003 | Murthy et al. |
| 2003/0235931 A1 | 12/2003 | Wada et al. |
| 2004/0097022 A1 | 5/2004 | Werkhoven et al. |
| 2005/0054175 A1 | 3/2005 | Bauer |
| 2005/0079692 A1 | 4/2005 | Samoilov et al. |

FOREIGN PATENT DOCUMENTS

| | | |
|---|---|---|
| WO | WO 00/15885 | 3/2000 |

OTHER PUBLICATIONS

Bauer et al., "Relaxed SiGe Buffers with Thickness below 0.1 μm", Thin Solid Films 369:152-156 (2000).

Bauer et al., "High Ge Content Photodetectors on Thin SiGe Buffers", Materials Science and Engineering B89:77-83 (2002).

Bauer et al., "Crystalline to Amorphous Phase Transition in Very Low Temperature Molecular Beam Epitaxy", Materials Science and Engineering B89:263-268 (2002).

Christiansen et al., "Strain Relaxation Mechanisms in He$^+$-Implanted and Annealed $Si_{1-x}Ge_x$ Layers on Si(001) Substrates", Material Research Society Symposium Proceedings 686:A1.6.1-A1.6.6 (2002).

Haynes et al., "Composition Dependence of Solid-Phase Epitaxy in Silicon-Germanium Alloys: Experiment and Theory", Physical Review B 51:7762-7771 (1995).

Herzog et al., "Si/SiGe n-MODFETs on Thin SiGe Virtual Substrates Prepared by Means of He Implantation", IEEE Electron Device Letters, 23:485-487 (2002).

Huang et al., "SiGe-on-Insulator Prepared by Wafer Bonding and Layer Transfer for High-Performance Field-Effect Transistors", Applied Physics Letters 78:1267-1269 (2001).

Huang et al., "Electron and Hole Mobility Enhancement in Strained SOI by Wafer Bonding", IEEE Transactions on Electron Devices 49:1566-1571 (2002).

Kamins et al., "Deposition of Three-Dimensional Germanium Islands on Si(001) by Chemical Vapor Deposition at Atmospheric and Reduced Pressures", J. Appl. Phys. 81:211-219 (1997).

Kasper et al., "New Virtual Substrate Concept for Vertical MOS Transistors", Thin Solid Films 336:319-322 (1998).

Kutsukake et al., "Fabrication of SiGe-On-Insulator through Thermal Diffusion on Germanium on Si-on-Insulator Substrate", Jpn. J. Appl. Phys. 42:L232-L234 (2003).

Liszkay et al., "Strain Relaxation Induced by He-Implantation at the $Si_{1-x}Ge_x$/Si(100) Interface Investigated by Positron Annihilation", Applied Surface Science 194:136-139 (2002).

Lyutovich et al., "Interaction Between Point Defects and Dislocations in SiGe", Solid State Phenomena 67-70:179-184 (1999).

Lyutovich et al., "Relaxed SiGe Buffer Layer Growth with Point Defect Injection", Materials Science and Engineering B71:14-19 (2000).

Lyutovich et al., "Thin SiGe Buffers with High Germanium Content for n-MOSFETs", Materials Science and Engineering B89:341-345 (2002).

Luysberg et al., "Effect of Helium Ion Implantation and Annealing on the Relaxation Behavior of Pseudomorphic $Si_{1-x}Ge_x$ Buffer Layers on Si(100) Substrates", Journal of Applied Physics 92:4290-4295 (2002).

Medeiros-Ribeiro et al., "Equilibrium Size Distributions of Clusters During Strained Epitaxial Growth", Materials Science and Engineering B67:31-38 (1999).

Ni et al., "X-ray Reciprocal Space Mapping Studies of Strain Relaxation in Thin SiGe Layers ($\leqq$100 nm) Using a Low Temperature Growth Step", Journal of Crystal Growth 227-228:756-760 (2001).

Sugii et al., "SiGe-on-Insulator Substrate Fabricated by Melt Solidification for a Strained-Silicon Complementary Metal-Oxide-Semiconductor", J. Vac. Sci. Technol. B20(5):1891-1896 (2002).

Sugiyama et al., "Formation of Strained-Silicon Layer on Thin Relaxed-SiGe/SiO$_2$/Si Structure Using SIMOX Technology", Thin Solid Films 369:199-202 (2000).

Teichert et al., "Interplay of Dislocation Network and Island Arrangement in SiGe Films Grown on Si(001)", Thin Solid Films 380:25-28 (2000).

Trinkaus et al., "Strain Relaxation Mechanisms for Hydrogen-Implanted $Si_{1-x}Ge_x$/Si(100) Heterostructures", Applied Physics Letters 76:3552-3554 (2000).

U.S. Appl. No. 10/800,390, filed Mar. 12, 2004.

U.S. Appl. No. 10/898,021, filed Jul. 23, 2004.

Cannon, D. et al., "Tensile strained epitaxial Ge films on Si(100) substrates with potential application in L-band telecommunications," Applied Physics Letter, vol. 84, No. 6, Feb. 9, 2004, pp. 906-908.

Colace, L. et al., "Efficient high-speed near-infrared Ge photodetectors integrated on Si substrates," Applied Physics Letter, vol. 76, No. 10, Mar. 6, 2000, pp. 1231-1233.

Colace, L. et al., "Ge-on-Si Approaches to the Detection of Near-infrared Light," IEEE Journal of Quantum Electronics, vol. 35, No. 12, Dec. 1999, pp. 1843-1852.

Fama, S. et al., "High performance germanium-on silicon detectors for optical communications," Applied Physics Letters, vol. 81, No. 4, Jul. 22, 2002, pp. 586-588.

Hull, R., "Metastable strained layer configurations in the SiGe/Si System," (1999) *EMIS Datareviews, Series No. 24 of SiGe and SiGe:C*, edited by Erich Kasper et al., Inspec (2000), London, UK.

Ishikawa, Y. et al., "Strain-induced band gap shrinkage in Ge grown on Si substrate," Applied Physics Letters, vol. 82, No. 12, Mar. 31, 2003, pp. 2044-2046.

Lee et al., "Growth of strained Si and strained Ge heterostructures on relaxed Si1xGax by ultrahigh vacuum chemical vapor deposition," J. Vac. Sci. Technol. B 22(1) (Jan./Feb. 2004).

Li, Q, et al., "Selective growth of Ge on Si(100) through vias of SiO2 nanotemplate using solid source molecular beam epitaxy," Applied Physics Letter, vol. 83, no. 24, Dec. 15, 2003, pp. 5032-5034.

Liu, J. et al., "Silicidation—induced band gap shrinkage in Ge epitaxial films on Si," Applied Physics Letters, vol. 84, No. 5, Feb. 2, 2004, pp. 660-662.

Masini, G. et al., "High-Performance p-i-n Ge on Si Photodetectors for the Near Infrared: From Model to Demonstration," IEEE Transactions of Electron Devices, vol. 48, No. 6, Jun. 2001, pp. 1092-1096.

Schollhorn et al., "Coalescence of geranium islands on silicon, Thin Solid Films," vol. 336 (1988), pp. 109-111.

International Search Report and Written Opinion, PCT Application PCT/US04/23505, mailed Jun. 13, 2006.

* cited by examiner

DEPOSITION OF SILICON GERMANIUM ON SILICON-ON-INSULATOR STRUCTURES AND BULK SUBSTRATES

PRIORITY APPLICATION

This application claims the benefit of U.S. Provisional Patent Application 60/489,691, filed 23 Jul. 2003, the entire disclosure of which is hereby incorporated by reference herein.

FIELD OF THE INVENTION

The present invention relates generally to strained silicon on strain relaxed silicon germanium, including silicon-germanium-on-insulator ("SGOI") technology in integrated circuit fabrication.

BACKGROUND OF THE INVENTION

To improve device performance, a trend is developing for replacing conventional "bulk" silicon wafers with so-called silicon-on-insulator ("SOI") wafers. The advantage of SOI technology is that the silicon in which transistors are made is not in electrical contact with the remainder of the wafer, such that no cross-talk among transistors takes place through the wafer bulk. The transistors are more effectively electrically isolated from one another.

SOI technology typically employs a thin (e.g., about 100 nm) insulating layer between the active semiconductor layer and the wafer, across the entire wafer or at least in those areas where active devices will be formed in the semiconductor layer. Silicon oxide, silicon nitride, or a combination of the two are typically employed as the insulating layer. These materials are amorphous, have excellent electrical properties, and the technology for integrating silicon nitride and/or silicon oxide is very well developed.

Two conventional technologies have been developed forming the SOI structures. One technology, known as SIMOX, starts with a semiconductor structure such as a silicon wafer and employs high energy implantation of oxygen atoms to form an oxide layer greater than about 100 nm below the surface of the silicon wafer. High temperature annealing then forms a buried silicon oxide, and at the same time repairs crystal defects in the surface silicon that are created by implantation. The surface silicon remains a semiconductor material, and the crystal structure thereof is restored by the annealing process. These steps are rather expensive, however, and the quality of the insulating layer and the active silicon thereover is somewhat compromised.

Another method for forming SOI structures is based on bonding a sacrificial silicon wafer onto an oxidized silicon wafer. By grinding or other thinning process, the sacrificial silicon wafer is reduced to a very thin, active semiconductor layer over the oxide from the other substrate. The thinning process, however, is critical to achieving high quality in the SOI structure, since the ultimately desired thickness uniformity of the active semiconductor layer is about 5 nm±0.1 nm. Furthermore, the bonding and thinning processes are complicated and rather expensive.

Strained silicon is utilized to increase carrier mobility and thus the operating speed of transistors. Typically a thin layer of silicon germanium (SiGe) is formed on a substrate and a very thin layer of silicon is deposited over the SiGe. Silicon has a smaller lattice constant than germanium, and when the silicon layer is grown on relaxed SiGe, the silicon atoms tend to align themselves with the more widely spaced atoms in the underlying layer. As a result, the top silicon layer is stretched, or strained, allowing electrical carriers to flow with less resistance.

Strained silicon and SOI are complementary technologies and several attempts have been made to fabricate SiGe-On-Insulator (SGOI) substrates.

SUMMARY OF THE INVENTION

In accordance with one aspect of the invention, a method for forming a strained silicon on strain relaxed SiGe-on-insulator structure includes forming an amorphous SiGe layer on an SOI substrate by CVD and annealing the substrate at a temperature that causes the SiGe layer to melt. Ge from the SiGe layer diffuses into the underlying Si layer at the annealing temperature, producing a relaxed SiGe layer over an oxide.

In accordance with another aspect of the invention, a method for forming a strain-relaxed SiGe layer on a substrate comprises depositing an amorphous SiGe layer over a silicon layer by CVD using trisilane as a precursor. Solid phase epitaxy is conducted to crystallize the SiGe layer over the silicon layer. Prior to depositing the amorphous SiGe layer, the silicon layer is covered with less than one monolayer of oxide, leaving some crystal silicon regions exposed.

In a further aspect of the invention, a method for forming a strain relaxed SiGe layer over a silicon layer on a substrate comprises heteroepitaxy of SiGe at low temperature. Preferably the strained SiGe layer is deposited by CVD from trisilane and a germanium precursor. A bubble forming agent, such as H or He is implanted at or below the Si/SiGe interface and the SiGe layer is annealed. During annealing the SiGe layer relaxes. A strained silicon layer can subsequently be deposited over the relaxed SiGe layer.

BRIEF DESCRIPTION OF THE DRAWINGS

These and other aspects of the invention will be readily apparent from the detailed description below and from the appended drawings, which are meant to illustrate and not to limit the invention, and in which.

DETAILED DESCRIPTION OF THE PREFERRED EMBODIMENTS

Preferred Processes

As used herein, "single-crystal" or "epitaxial" is used to describe a predominantly large crystal structure that may have a tolerable number of faults therein. The skilled artisan will appreciate that crystallinity of a layer generally falls along a continuum from amorphous to polycrystalline to single-crystal; the skilled artisan can readily determine when a crystal structure can be considered single-crystal or epitaxial, despite a low density of faults.

The term "amorphous" includes small grain polycrystalline structures that can be readily redistributed, such as by the solid phase epitaxy (SPE) or the melt processes described herein.

Epitaxy refers to deposition where the deposited layer serves as an extension of the crystal structure of an underlying layer. Heteroepitaxy is a species of epitaxy in which the underlying layer and the overlying deposited layer are of different materials.

Heteroepitaxy deposition techniques are well known in the art and, in fact, are considered advantageous in creating crystal strain by the lattice mismatch between the underlying layer and the overlying layer. Typically, such heteroepitaxial layers are formed by epitaxially depositing silicon germanium over a single-crystal silicon structure, such that the lattice constants of the two layers are not exactly matched. This strain is considered advantageous because it increases electrical carrier mobility within the semiconductor structure, thus boosting transistor performance. For complementary metal oxide semiconductor field effect transistors (CMOS) based on SiGe barriers, a band discontinuity of the valence band and the conduction band is needed. Whereas tensily strained Si and compressively strained SiGe deliver a staggered band offset (type II heterointerface), the conduction band offset for strained SiGe on Si is negligible. One of the main challenges is the availability of a relaxed SiGe structure with smooth surface morphology and less defects.

Figure 9:
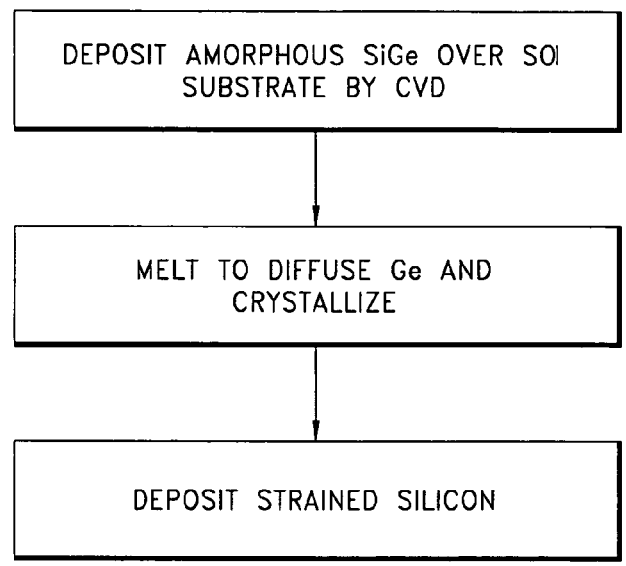
FIG. 9 is flow chart illustrating a method for forming strained silicon over a strain relaxed SiGe layer.

Melt Solidification Process to Form Strain-Relaxed SiGe (FIG. 9)

Completely strain relaxed SiGe layers can be formed on SOI substrates by employing a melt solidification process. (See Sugii et al. J. Vac. Sci. Technol. B 20(5): 1891–1896 (2002); Kutsukake et al. Jpn. J. Appl. Phys. 42:L232–L234 (2003), the disclosures of which are incorporated herein by reference). Thin SiGe and silicon layers are grown on a conventional SOI wafer, the topmost silicon layer is oxidized and a high-temperature annealing is performed to partially melt the SiGe layer. Solidification produces a strain relaxed SiGe layer. The layer has a uniform composition as a result of germanium diffusion into the topmost silicon layer on the SOI substrate. Thus, a relaxed SiGe layer is left directly on the oxide of the SOI wafer. The resulting layer preferably has a defect density of less than about $1 \times 10^5$ $cm^{-2}$, more preferably less than about $1 \times 10^3$ $cm^{-2}$, and even more preferably less than about 1000 $cm^{-2}$. Unfortunately, neither molecular beam epitaxy (MBE) as disclosed by Kutsukake and Sugii nor CVD employing conventional precursors are capable of commercially satisfactory deposition of α-SiGe in this context.

Figure 1:
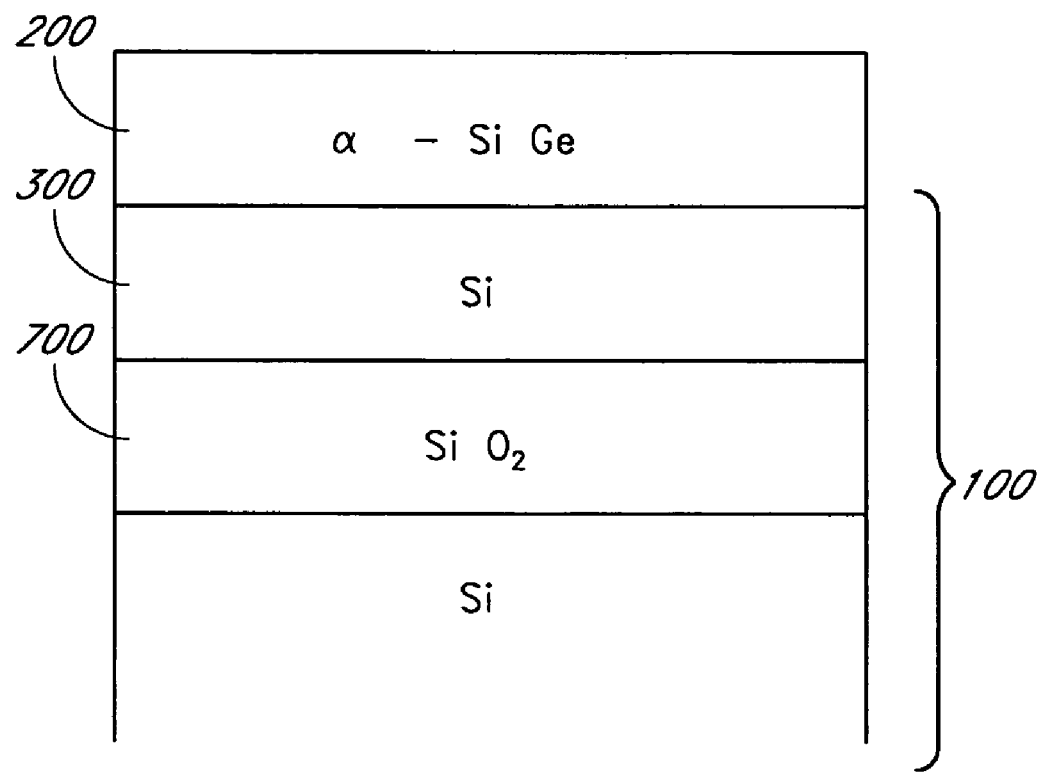
FIG. 1 is a schematic cross section showing deposition of an amorphous silicon germanium (α-SiGe) layer over a silicon-on-insulator (SOI) wafer.

Referring now to FIGS. 1–5, a general method in accordance with a preferred embodiment is illustrated. Initially, an amorphous or small grain polycrystalline SiGe layer 200 is deposited on a silicon-on-insulator (SOI) substrate 100 (FIG. 1). SOI substrates are commercially available, for example from SOITEC (Bernin, France). By depositing an amorphous or small grain polycrystalline SiGe layer, the formation of defects in the underlying silicon layer is avoided.

Deposition of the amorphous or small grain polycrystalline SiGe layer 200 is preferably carried out by chemical vapor deposition (CVD) in a reactor such as the Epsilon™ CVD reactor available from ASM America. Preferably, deposition is from trisilane ($Si_3H_8$) and $GeH_4$ (or other germanium precursor(s)) at a temperature of about 350° C. to about 700° C., more preferably from 400° C. to 600° C., and a pressure from about 1 Torr to about atmospheric pressure, more preferably 50 Torr to 760 Torr, most preferably 760 Torr. Preferably the main carrier is $H_2$ at a flow rate of about 2 to about 100 slm. The amorphous or small grain polycrystalline nature of the deposited SiGe layer can be realized by a number of different methods. Advantageously, deposition under these conditions (e.g., 760 Torr) can produce α-SiGe at rates of greater than 300 Å/min for 40% [Ge] at 500° C., or at rates of greater than 200 Å/min, more preferably greater than 300 Å/min for 50% [Ge] at 475° C.

Figure 6:
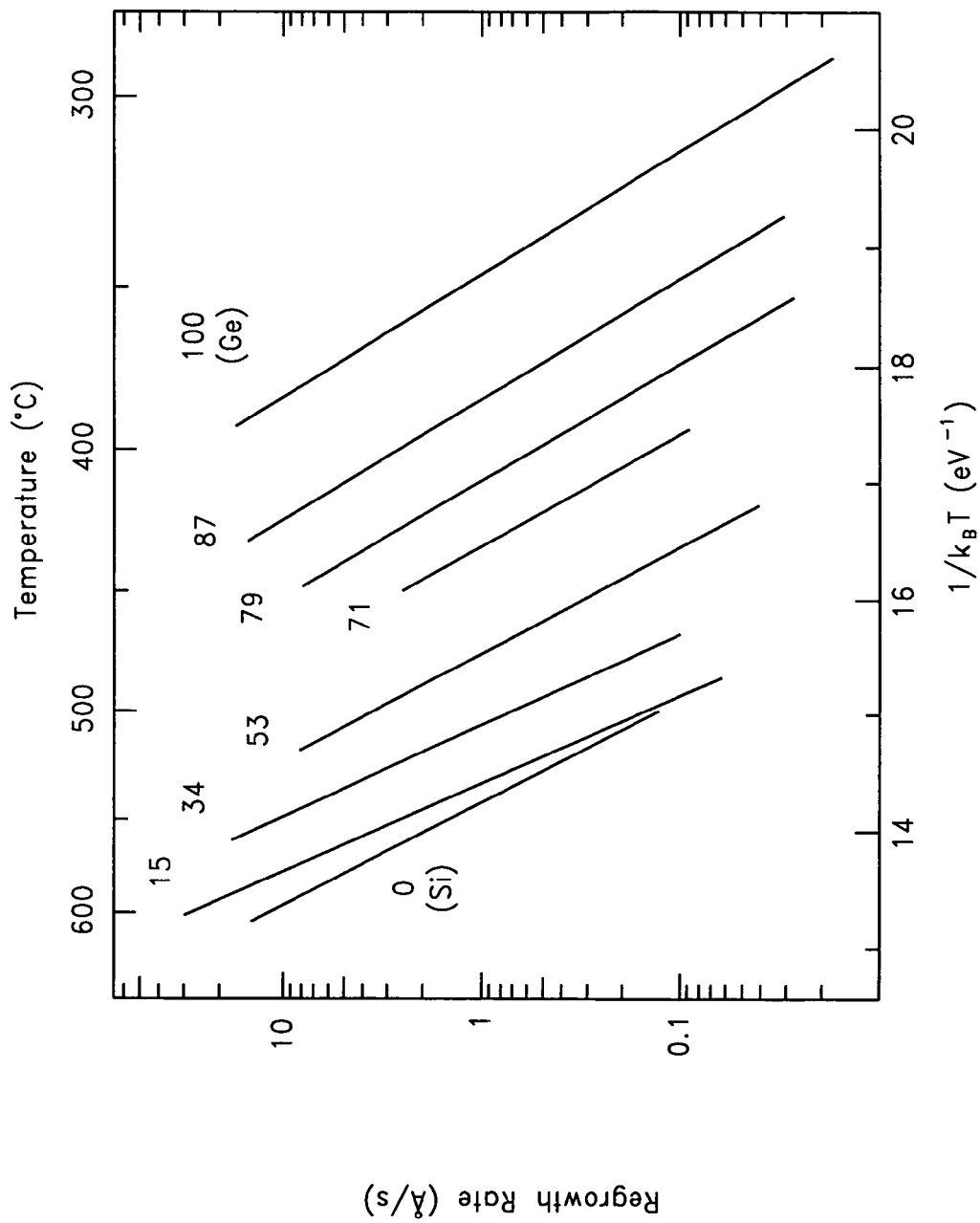
FIG. 6 is a chart illustrating crystallization rates of solid phase epitaxy, for various different concentrations of germanium in the SiGe layer.

In one embodiment the deposition conditions are chosen such that the deposition rate of SiGe is faster than the rate of recrystallization of the SiGe layer. Solid phase epitaxy (SPE) or random nucleation growth (RNG) will lead to recrystallization of the SiGe layer as it is deposited. The rate of recrystallization, or regrowth, is dependent upon the temperature and the germanium concentration, as shown in FIG. 6. If the rate of recrystallization is greater than the rate of deposition, an amorphous or small grain polycrystalline layer will not be achieved. Thus, for germanium concentrations of about 50%, the deposition temperature is preferably below about 500° C., more preferably below about 475° C., in order to keep the rate of SPE or RNG below the deposition rate and achieve an amorphous layer. Pressure and carrier gas flow, such as $H_2$ flow, are adjusted in the CVD process to optimize the deposition rate at the desired temperature.

Amorphous or small grain polycrystalline SiGe may also be realized by deposition of SiGe by CVD on a silicon layer that is at least partially covered with oxide. For example, the SiGe layer may be deposited on the native oxide on an SOI substrate. Preferably the oxide is at least about a quarter of a monolayer on the silicon surface, more preferably at least about a half a monolayer. On the other hand, less than a full monolayer is preferably formed on the silicon surface in order to leave some single-crystal Si exposed. In a particular embodiment, a half monolayer of oxide is formed on the SOI substrate by heating in an oxygen environment at the deposition temperature. Upon high temperature treatment for melting the SiGe layer as described below, the oxide is reduced, leading to formation of a homogeneous SiGe layer upon solidification.

Alternatively, a thicker chemical oxide may be formed on the Si surface of the SOI wafer prior to deposition of the SiGe layer, such as by conventional SC1 solutions. In this case, regrowth of the SiGe layer during deposition is not possible due to the absence of contact with the underlying crystalline silicon layer. As a result, the CVD conditions for deposition of SiGe can be adjusted to optimize deposition rate and precursor consumption, rather than to avoid recrystallization and consequent faults. As with a partial oxide layer, the high temperature treatment for melting the SiGe layer will reduce the oxide, allowing for the formation of a strain relaxed SiGe layer of uniform composition.

In a further embodiment, up to about a monolayer of a dopant such as boron, arsenic, phosphorus, Sb or C is formed on the substrate surface prior to deposition of the SiGe layer. This thin layer prevents regrowth as the SiGe layer is deposited. Preferably a brief spike of gas comprising a dopant precursor is introduced prior to beginning the SiGe deposition process to produce up to about a monolayer of dopant on the silicon surface. Upon high temperature melting, this intermediate dopant layer is diffused, leading to formation of a uniform strain-relaxed SiGe layer upon solidification.

The thickness of the SiGe layer 200 that is deposited will be determined based on the desired concentration of germanium in the strain-relaxed SiGe layer that results from the high temperature melt. The necessary thickness to achieve a particular final germanium concentration can be readily calculated based on the germanium concentration of the deposited layer and the thickness of the underlying silicon layer (which is consumed by Ge diffusion) on the SOI wafer.

The underlying silicon layer 300 preferably has a thickness of from about 50 Å to about 500 Å. Thinner silicon layers are preferred because this allows for the use of a thinner SiGe layer and/or a lower initial germanium concentration in the deposited SiGe layer. For example, a relaxed SiGe layer comprising about 20% germanium is currently desired in the industry. Thus, if a 50 Å silicon layer is present on the SOI wafer, a 50 Å SiGe layer with a 40% germanium concentration could be deposited. Upon melting and solidification, germanium will diffuse from the SiGe layer, as described below, into the silicon layer. The result will be a 100 Å SiGe layer with a germanium concentration of about 20%.

Figure 7:
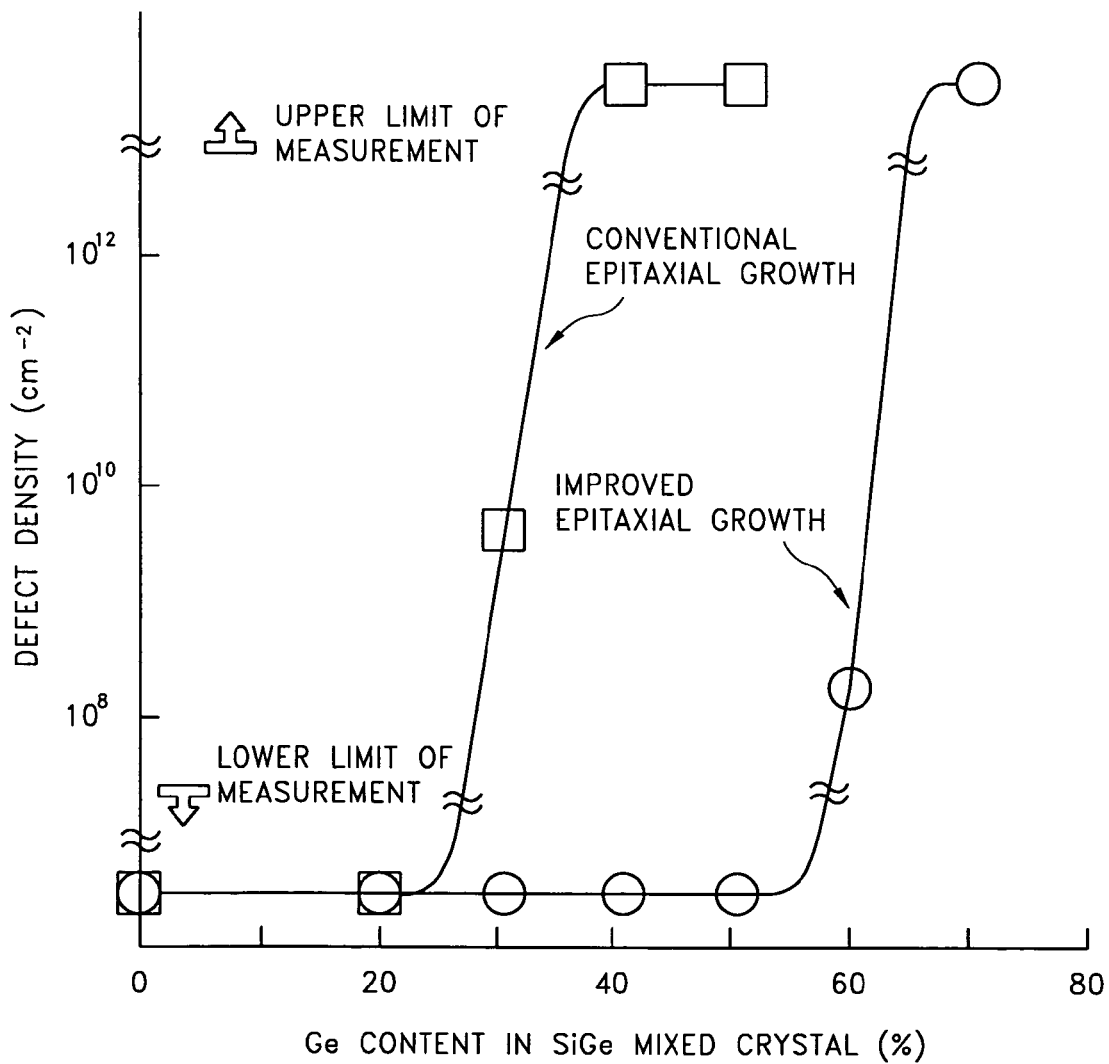
FIG. 7 illustrates defect density versus germanium content using conventional epitaxy and formation of the relaxed SiGe layer in accordance with the preferred embodiments.

Preferably the resulting germanium concentration in the deposited layer is below about 60%, more preferably below about 50% in order to minimize defect density. As can be seen in FIG. 7, above a concentration of about 60% germanium, the defect density increases significantly during SPE. See U.S. Pat. No. 6,346,732, incorporated herein by reference. Although a high temperature melt is employed, as described below, the temperature moves through the range for SPE and thus the formation of defects during SPE is a consideration.

Figure 2:
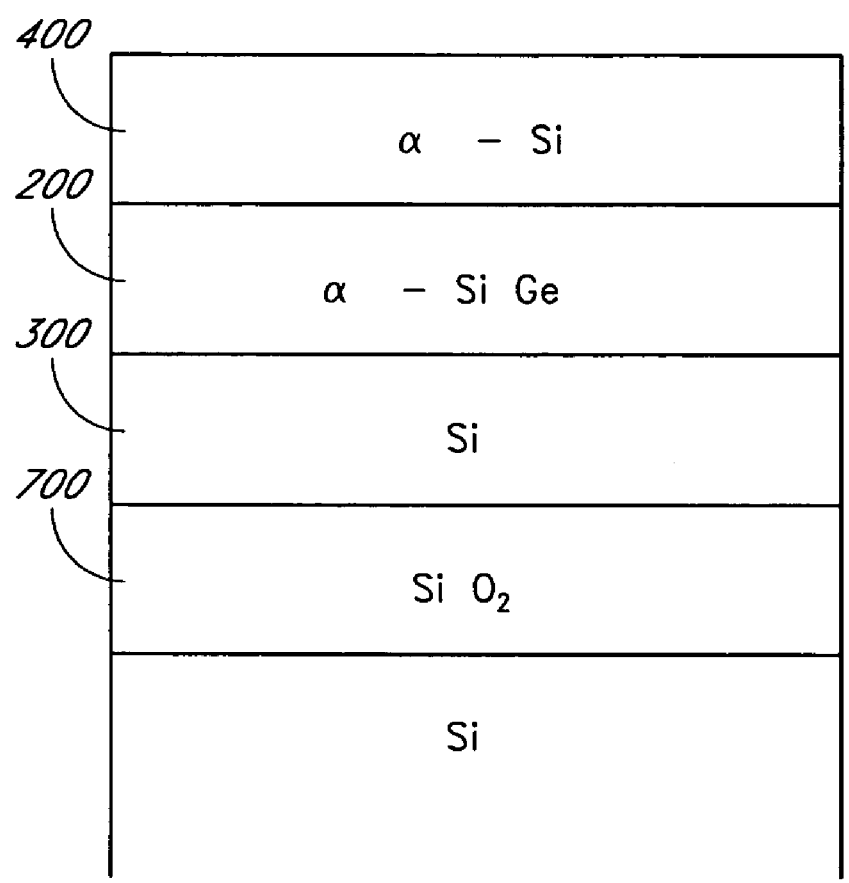
FIG. 2 illustrates deposition of an amorphous silicon (αSi) layer over the α-SiGe layer of FIG. 1.

Following deposition of the SiGe layer, a cap layer 400 is formed (FIG. 2). Preferably, the cap layer is formed directly over the SiGe layer 200. The cap layer prevents evaporation of Ge from the underlying SiGe layer 200 during the subsequent high temperature melting, described below. A SiO$_2$-cap layer with a smooth interface prevents the SiGe interface from roughening. Preferably an amorphous silicon layer 400 is deposited over the SiGe layer. The amorphous silicon layer 400 is typically deposited by CVD, preferably in the same reaction space as the SiGe layer 200. For example, after amorphous SiGe deposition, the flow of GeH$_4$ can be shut off, and layer of amorphous silicon can be grown from trisilane at the same deposition temperature.

Figure 3:
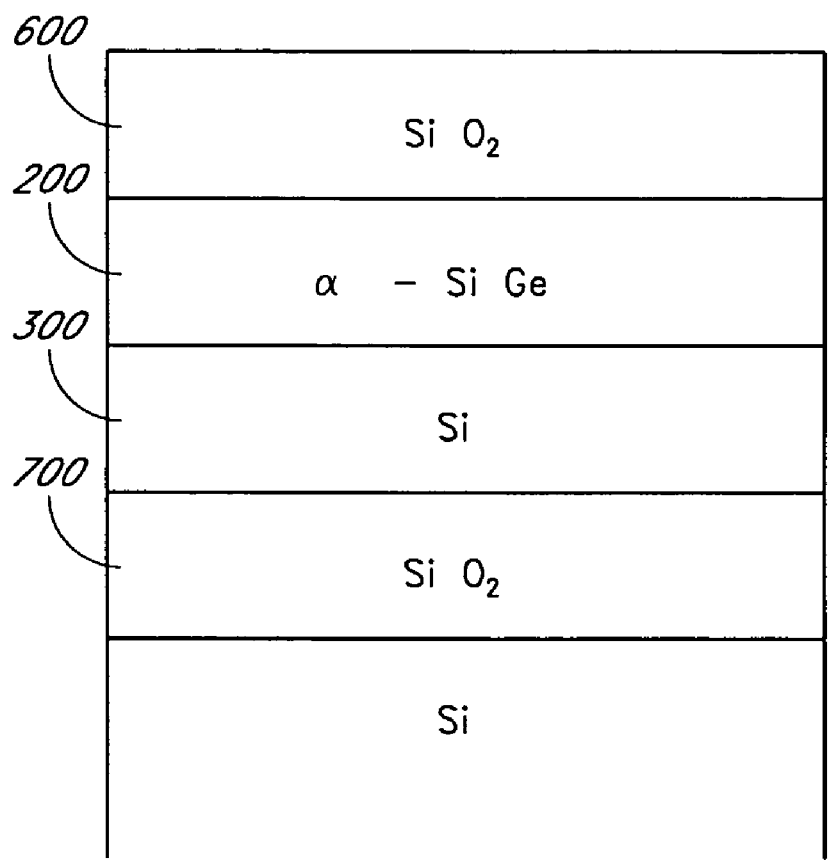
FIG. 3 illustrates formation of a silicon oxide over the α-SiGe layer of FIG. 1, either by oxidation of the α-Si layer of FIG. 2 or by separate deposition of SiO2 over the α-SiGe layer of FIG. 1.
Figure 4:
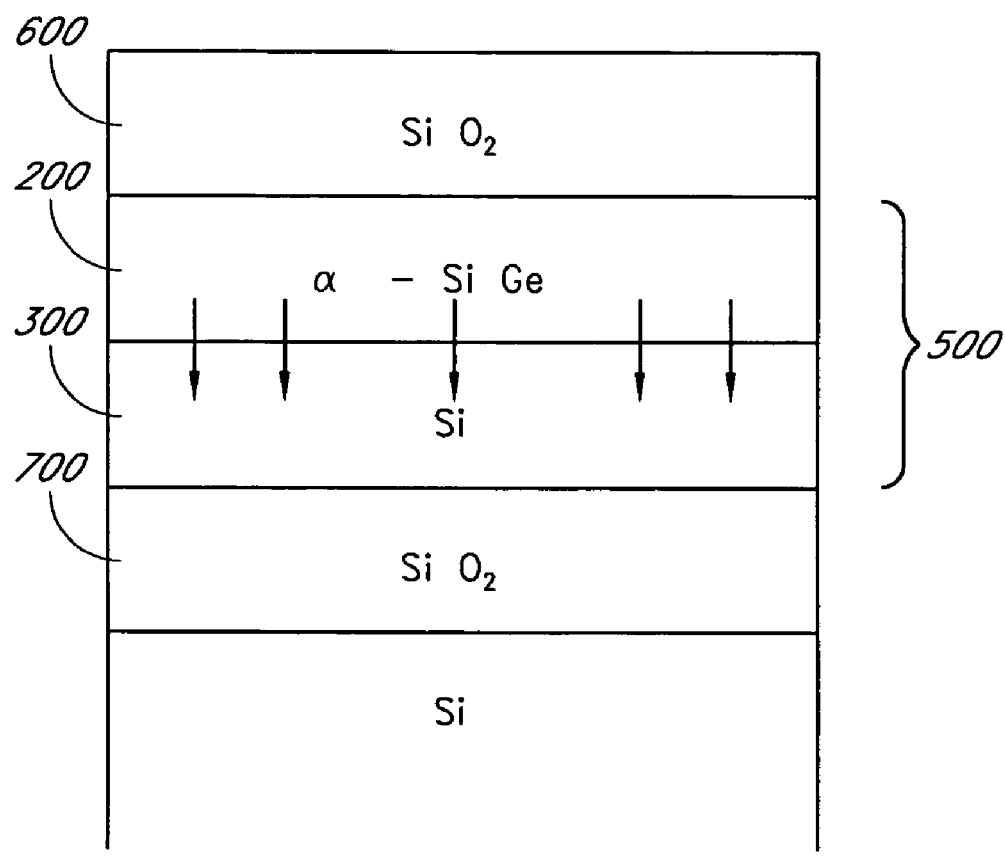
FIG. 4 illustrates a melting/diffusion process in accordance with a preferred embodiment of the present invention.

Following deposition, the amorphous silicon layer is preferably oxidized to form a SiO$_2$ cap layer 400 (FIG. 3). Preferably, oxidation is accomplished by exposing the substrate to an oxidizing environment. Any oxidant known in the art may be used, preferably water or oxygen. In one embodiment, dry oxygen is used. In another embodiment the α-Si layer 400 is wet oxidized. The oxidation temperature is preferably between about 800° C. and about 900° C. In one embodiment the oxidation is combined with the high temperature melt treatment by the temporary addition of oxygenated species during the high temperature anneal. The oxygen atmosphere is preferably removed for the high temperature melt. Alternatively, an oxide, preferably SiO$_2$, can be deposited ex-situ. In one embodiment, an oxide is deposited ex situ at a temperature low enough to avoid SPE of the SiGe layer.

Figure 5:
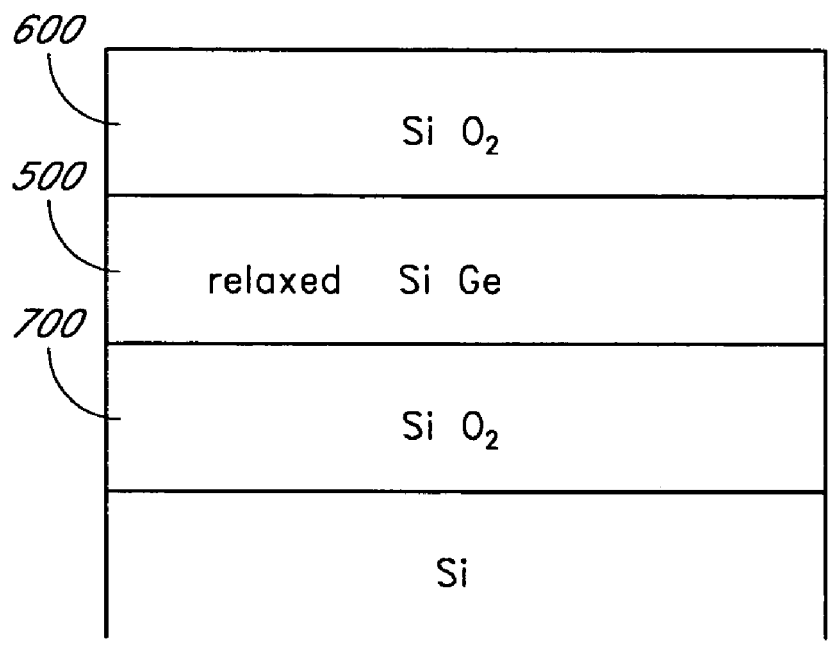
FIG. 5 illustrates a relaxed SiGe layer as a result of the melting/diffusion process.

The substrate is then subjected to a high temperature melt, preferably in a non-reactive environment, such as in a N$_2$ or Ar atmosphere. At the high temperature, the SiGe layer at least partially melts. During the melting process, germanium diffuses from the SiGe layer 200 into the underlying silicon layer 300, as illustrated by the arrows in FIG. 4. Upon solidification, a strain relaxed SiGe layer of uniform composition is produced, as shown in FIG. 5. Advantageously, vertical or threading dislocations are minimized by this process. Threading dislocations are preferably less than $10^7$ cm$^{-2}$, more preferably $10^5$ cm$^{-2}$, and most preferably about 1000 cm$^{-2}$.

Figure 8:
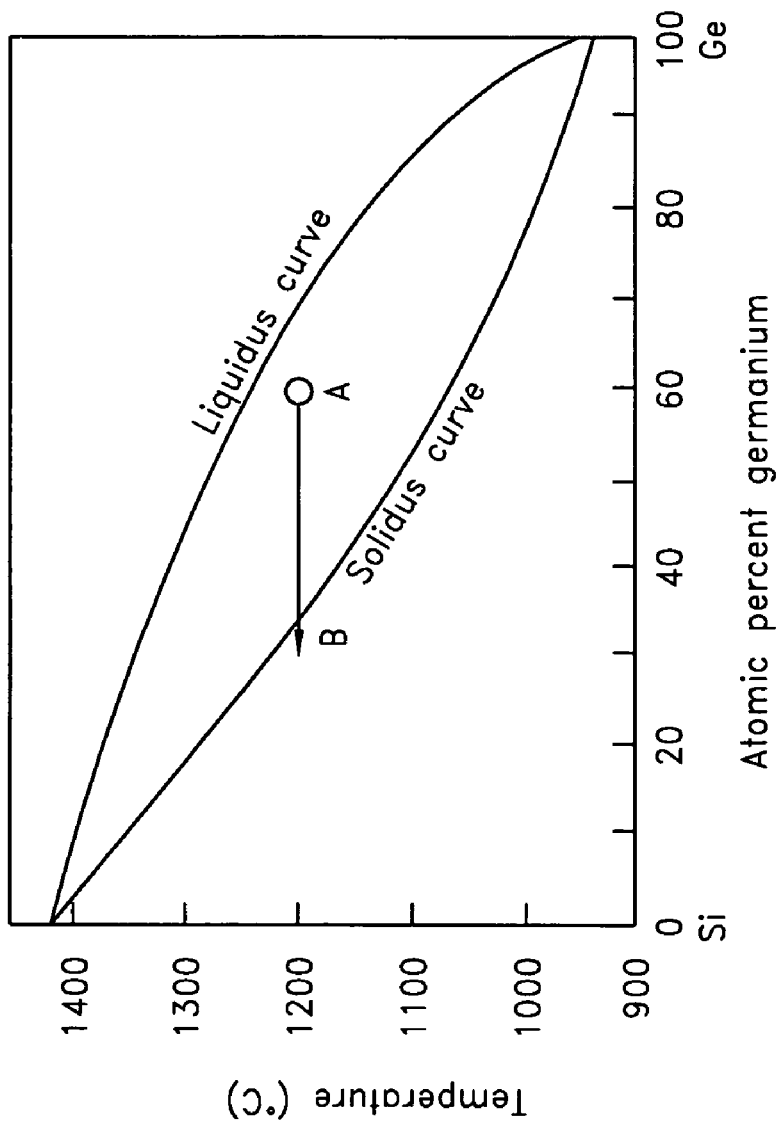
FIG. 8 illustrates melt and solidification temperatures against germanium concentration in a SiGe layer.

High temperature annealing is preferably carried out at a temperature between about 950° C. and about 1425° C., more preferably the temperature is greater than about 1000° C. and less than about 1425° C. The melting temperature is a critical parameter in forming a uniform strain relaxed SiGe layer. If the entire SiGe layer 500 (including the Si layer into which Ge has diffused) between the two SiO$_2$ layers 600, 700 is melted, all crystal information is lost and the resulting layer is polycrystalline and not a strain relaxed epitaxial layer. See Sugii et al., supra. FIG. 8 shows a graph of the solidus and liquidus curve as a function of temperature and germanium concentration. A temperature for the high temperature melt is preferably chosen that is just to the left of the solidus curve for a given final germanium concentration in the resulting SiGe layer 500. For example, in the situation where the deposited SiGe layer 200 (FIG. 4) comprises 60% germanium and the resulting SiGe layer 500 (FIG. 5) comprises 40% germanium, the initial SiGe layer will melt at 1150° C. However, the resulting SiGe layer will be solid at that temperature. Thus, there will not be complete melting of both layers and enough crystal structure will remain to allow for formation of a uniform strain relaxed epitaxial SiGe layer 500. However, if a temperature of 1200° C. is used (just to the right of the solidus curve for 40% Ge concentration), both the initial SiGe layer 200 and the resulting SiGe layer 500 will melt. No crystal structure will remain and crystallization will not occur.

The high temperature is preferably maintained for a sufficient length of time for germanium to diffuse throughout the underlying silicon layer 300, resulting in a uniform SiGe layer 500. Thus, the appropriate time for the high temperature melt can be determined based on the thickness of the underlying Si layer, the thickness of the deposited SiGe layer, the germanium concentration of the deposited SiGe layer and the diffusion coefficient of germanium in silicon at the chosen temperature (See Sugii et al., supra). Preferably the melt temperature is maintained for from 1 minute to 12 hours, more preferably from 1 to 2 hours at a melt temperature of about 1050° C.–1300° C., dependent on the final [Ge]-content. Thus, rather than solidifying by cooling, a single temperature is selected to cause diffusion of the germanium until the resulting silicon germanium layer concentration drops below the solidus curve at the selected anneal temperature.

Following solidification, the substrate can be subject to further processing as desired for a particular application. Typically, the SiO$_2$ cap layer 400 is removed by chemical etch. A strained silicon layer is then deposited heteroepitaxially over the strain-relaxed SiGe layer.

Figure 10:
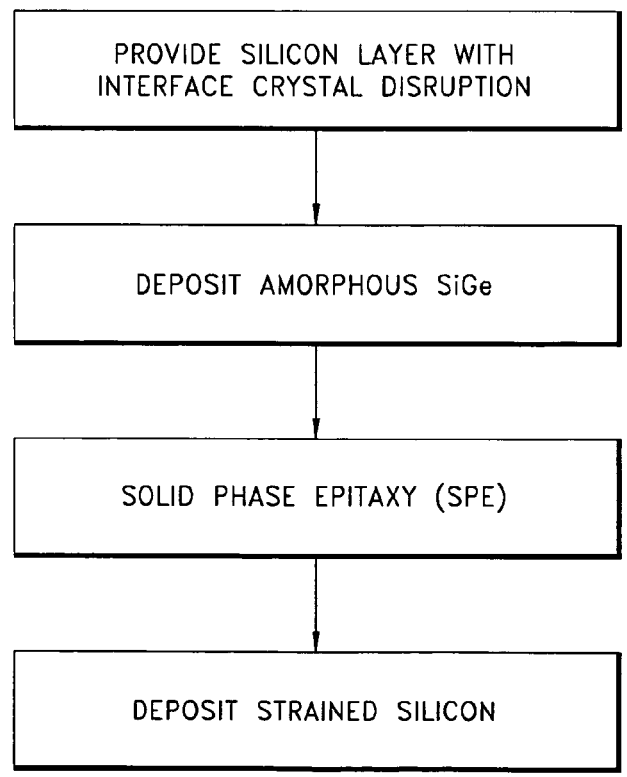
FIG. 10 is a flow chart illustrating another method for forming strained silicon over a strain relaxed SiGe layer.

SPE Process to Form Strain Relaxed SiGe with Low Defect Density (FIG. 10)

In another aspect of the invention, strain-relaxed SiGe layers are formed by solid phase epitaxy. In this embodiment, epitaxial growth is disrupted at the SiGe/Si interface during the SPE process. Preferably, epitaxial growth is disrupted by interrupting the crystal structure at the SiGe/Si interface. The disruption may be caused, for example and without limitation, by defects in the Si layer itself, or by material formed or deposited on the Si layer.

Since SPE is disrupted, strain between the substrate and the epitaxial growth layer is released. As a result, a strain-relaxed SiGe layer is produced and threading defect formation is minimized, as described above with respect to the melt process.

SiGe is preferably deposited amorphously or in a small grain polycrystalline form on a substrate. The substrate may be, for example, a blanket silicon wafer or an SOI wafer.

Deposition of SiGe is preferably by CVD. Preferably, SiGe is deposited from trisilane and $GeH_4$, digermane, or any other Ge precursor. As described above for the high temperature melt process, to deposit amorphous SiGe, the deposition temperature is preferably low enough that the regrowth rate is slower than the deposition rate, and yet commercially acceptable deposition rates (preferably greater than 100 Å/min and more preferably between about 200 Å/min and 600 Å/min). The temperature, pressure and $H_2$ carrier flow are adjusted to optimize the deposition rate at a given temperature and germanium concentration. In one embodiment SiGe is deposited by CVD from trisilane and $GeH_4$ at a temperature of 475° C. In another embodiment the deposition temperature is 500° C. Preferably the deposition temperature is between about 400° C. and about 600° C.

The thickness of the SiGe layer that is deposited over the substrate will be determined based on the desired concentration of germanium in the strain-relaxed SiGe layer. Unlike in the case of the high temperature melt described above, the concentration of germanium in the SiGe layer need not change during processing, since the process can be conducted without Ge diffusion. Thus, the initial germanium concentration and final germanium concentration in the layer are preferably the same.

However, the germanium concentration in the deposited layer is preferably below about 60%, more preferably below about 50% in order to minimize defect density. As can be seen in FIG. 7, above a concentration of about 60% germanium, the defect density increases significantly during SPE. See U.S. Pat. No. 6,346,732, incorporated herein by reference. Thus, the SiGe layer that is deposited preferably has a germanium concentration between about 0% and about 60%, more preferably between about 20% and about 50%.

Epitaxial growth is disrupted by the presence of less than a monolayer of oxide on the substrate surface. In one embodiment, the oxide is a native oxide. In another embodiment the oxide is intentionally grown on the substrate. Preferably the oxide is less than a complete monolayer, more preferably less than three quarters of a monolayer and even more preferably less than about half a monolayer ($3.5 \times 10^{14}$ $cm^{-2}$). In a particular embodiment, a half monolayer of oxide is formed on the substrate by heating in an oxygen environment at the deposition temperature.

In one embodiment an oxide layer that is greater than one monolayer in thickness is formed. The oxide is then etched or otherwise reduced to expose at least some single-crystal Si. For example, a thicker chemical oxide may be formed on the substrate surface. The chemical oxide is then etched to preferably less than a monolayer, more preferably to less than about a half a monolayer. The etch process is carried out prior to deposition of the amorphous SiGe.

Following deposition of the SiGe layer, solid phase epitaxy is carried out. These methods are well known in the art. See, e.g., U.S. Pat. No. 6,346,732. Preferably, the substrate is heated to a temperature between about 500° C. and about 900° C. for approximately 30 minutes.

In one embodiment a thin layer of oxide, such as a native oxide, is formed on the SiGe layer prior to the SPE process. Exposing the SiGe layer to ambient (or any oxidizing atmosphere) to form a thin (native) oxide prior to the SPE process may help to further improve the surface smoothness during SPE.

Following SPE, a layer of silicon can be deposited heteroepitaxially over the SiGe. The relaxed nature of the SiGe layer will produce strain in the epitaxial silicon layer. If an oxide was deposited over the SiGe layer prior to SPE, the oxide is preferably removed prior to deposition of the silicon layer.

A layer stack, comprising a strain relaxed SiGe produced by SPE on a bulk substrate with a strained Si layer on top can be transferred by a layer transfer technique on top of an oxidized handle wafer, to form a strained Si (only) on Insulator (sSOI) by selective removal of the residual SiGe. Any layer transfer technique can be used, for example the Smart-Cut/Unibond™ technique (from SOITEC, Bernin, France), the Bond and Etch-back or Epitaxial-Layer transfer method (ELTRAN™; Canon NY, USA) or the Nano-cleave™ layer transfer method from SiGen (CA, USA).

Figure 11:
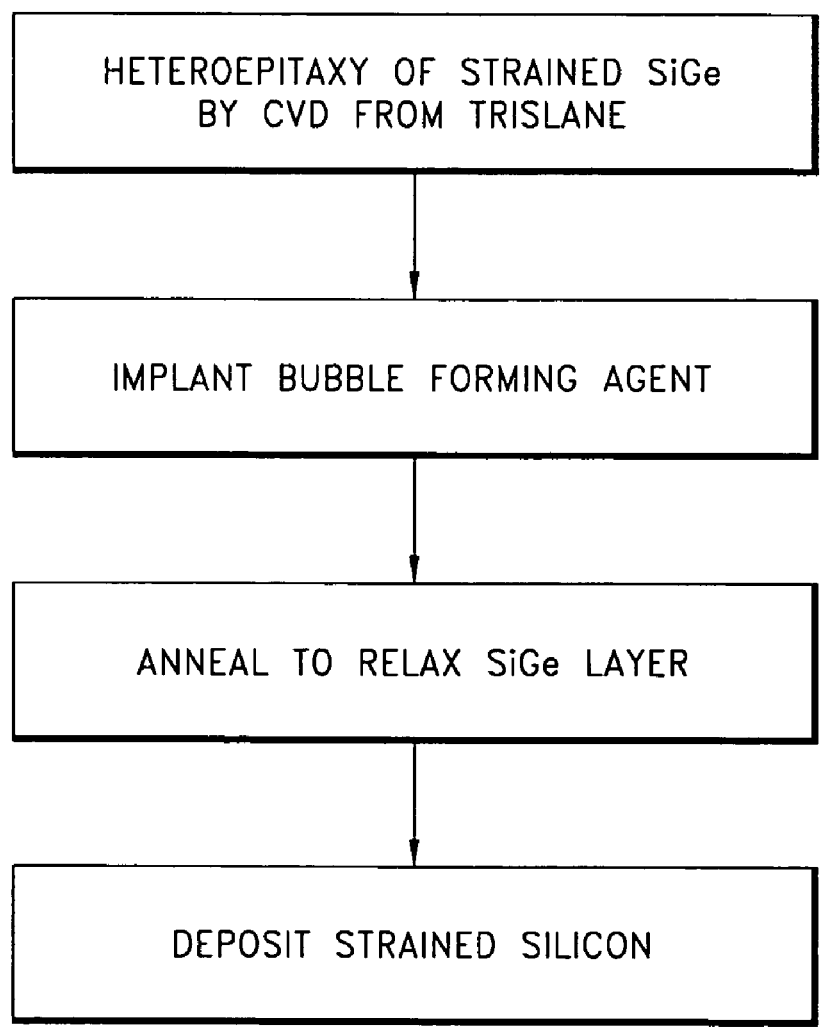
FIG. 11 is a flow chart illustrating a further method for forming strained silicon over a strain relaxed SiGe layer.

Heteroepitaxy Followed by Implantation and Anneal to Form Strain-Relaxed SiGe (FIG. 11)

In another aspect of the invention, strain-relaxed SiGe layers are formed by heteroepitaxy of SiGe on Si, followed by implantation of a bubble forming agent and subsequent annealing to relax the SiGe layer. The formation of defects during strain relaxation is prevented by the disruption of the crystal interface between the lower Si layer and the overlying SiGe layer. See, for example, Luysberg J. Applied Physics Oct. $15^{th}$, 2002; Herzog et al. IEEE Electron Device Letters 23:485 (2002); and Huange et al. Appl. Phys. Lett 78:1267 (2001), the disclosures of which are incorporated herein by reference.

SiGe is preferably deposited epitaxially by CVD from a silicon precursor and a germanium precursor, essentially as described above. Preferably the silicon precursor is trisilane. In one embodiment the germanium precursor is digermane. The deposition temperature is preferably from about 350° C. to about 700° C., more preferably from about 400° C. to about 600° C.

The SiGe layer is preferably deposited to a thickness below the critical thickness at which the layer will relax at the deposition temperature. Thus, the deposited SiGe layer remains strained. As the critical thickness is dependent on temperature, the deposition is preferably carried out at a low temperature in order to maximize overall layer thickness. A thicker layer is preferred as it will relax at a higher annealing temperature.

In one embodiment the SiGe layer is deposited to a thickness of about 50 to about 200 nm, more preferably from about 100 to about 150 nm.

Following deposition of the strained SiGe layer, a bubble forming agent, such as an ion, is implanted underneath the SiGe layer, preferably at or below the Si/SiGe interface. More preferably the bubble forming agent is implanted about 50 to about 100 nm below the Si/SiGe interface. In one embodiment the bubble forming agent is H⁺. In another embodiment the bubble forming agent is He⁺.

The bubble forming agent is implanted in an amount that is sufficient to disrupt the crystal structure at the Si/SiGe interface. In a particular embodiment approximately $1 \times 10^{16}$ ions cm$^{-2}$ to about $1 \times 10^{17}$ ions cm$^{-2}$ are implanted.

Implantation of oxygen at the Si/SiGe interface is also contemplated. In particular oxygen implantation may be used to form a fully relaxed SiGe layer on an SOI substrate. See, for example, Sugiyama et al. Thin Solid Films 369:199 (2000), incorporated herein by reference.

Subsequent annealing of the SiGe layer leads to relaxation of the layer. Preferably, annealing is carried out at a temperature between about 400° C. and about 1000° C., more preferably between about 700° C. and about 850° C. The annealing is preferably carried out for about 1 minute to about 12 hours, more preferably for about 1 minute to about 1 hour, more preferably for about 10 minutes. At the annealing temperature, bubbles form from the implanted bubble forming agent, for example H or He, and generate punch out dislocation loops. The dislocation loops migrate to or otherwise extend to the Si/SiGe interface and form strain relieving misfit dislocations. Again, because the layer is deposited to be less than the critical thickness, it remains strained until the anneal process, at which point relaxation is accommodated by the defects generated by the implant. Thus, extended crystalline defects, such as threading dislocations are avoided. Preferably, fewer than $10^7$ threading dislocations are present in the SiGe layer, more preferably less than $10^5$ and even more preferably less than $10^3$.

A Si cap layer is preferably deposited over the SiGe layer, producing a strained silicon layer. In one embodiment the SiGe cap layer is deposited after annealing. Preferably, however, the cap layer is deposited prior to annealing. For example, a cap layer of strained silicon about 10 to about 15 nm thick may be deposited over the strained SiGe layer prior to annealing.

In a further embodiment, the resulting layer stack is transferred to a handle wafer.

Although the foregoing invention has been described in terms of certain preferred embodiments, other embodiments will become apparent to those of ordinary skill in the art in view of the disclosure herein. Accordingly, the present invention is not intended to be limited by the recitation of preferred embodiments, but is intended to be defined solely by reference to the appended claims.

I claim:

1. A method comprising:
depositing an amorphous SiGe layer on a silicon-on-insulator ("SOI") substrate by chemical vapor deposition ("CVD"), the amorphous SiGe layer having a first germanium concentration;
depositing a SiO₂ layer over the amorphous SiGe layer; and
after depositing the SiO₂ layer, melting the amorphous SiGe layer at a temperature greater than 1000° C., thereby creating a SiGe-on-insulator substrate having a SiGe portion with a second germanium concentration that is less than the first germanium concentration.

2. The method of claim 1, wherein the amorphous SiGe layer is deposited using trisilane and GeH₄ precursors.

3. The method of claim 2, wherein the amorphous SiGe layer is deposited at a deposition temperature that is between about 400° C. and about 600° C.

4. The method of claim 1, wherein the amorphous SiGe layer is deposited on an oxide.

5. The method of claim 4, wherein the oxide is less than a monolayer.

6. The method of claim 5, wherein the oxide is less than half a monolayer.

7. The method of claim 4, wherein the oxide is greater than a monolayer.

8. The method of claim 4, wherein the oxide is a native oxide.

9. The method of claim 4, wherein the oxide is a chemical oxide.

10. The method of claim 1, wherein the amorphous SiGe layer is deposited on a monolayer of dopant.

11. The method of claim 10, wherein the dopant is selected from the group consisting of B, P, As, Sb or C.

12. The method of claim 1, wherein the amorphous SiGe layer is deposited at a rate that is faster than its rate of regrowth due to solid phase epitaxy ("SPE") or random nucleation growth ("RNG").

13. The method of claim 1, wherein the SOI substrate includes a silicon layer having a thickness between about 50 Å and about 500 Å.

14. The method of claim 1, wherein the first germanium concentration is between about 20% and about 60%.

15. The method of claim 1, wherein depositing a SiO₂ layer comprises depositing an amorphous silicon layer and oxidizing the amorphous silicon layer.

16. The method of claim 1, wherein:
the SOI substrate includes a silicon portion overlying an oxide portion; and
melting the amorphous SiGe layer further comprises melting the silicon portion of the SOI substrate.

17. The method of claim 1, wherein:
the SOI substrate includes a silicon portion overlying an oxide portion; and
melting the amorphous SiGe layer comprises diffusing germanium into the silicon portion of the SOI substrate.

18. The method of claim 1, wherein the SOI substrate includes a silicon portion overlying an oxide portion, and wherein the SiGe portion of the SiGe-on-insulator substrate contacts the oxide portion.

19. The method of claim 18, wherein the SiGe portion of the SiGe-on-insulator substrate has a defect density less than about $10^5$ cm$^{-2}$.

20. The method of claim 1, wherein the SiGe portion of the SiGe-on-insulator substrate has a defect density less than about $10^3$ cm$^{-2}$.

21. The method of claim 1, wherein the second germanium concentration is less than 50%.

22. The method of claim 1, wherein the SiGe portion of the SiGe-on-insulator substrate has a substantially uniform germanium concentration.

* * * * *